(12) United States Patent
Nagel et al.

(10) Patent No.: US 7,320,934 B2
(45) Date of Patent: Jan. 22, 2008

(54) METHOD OF FORMING A CONTACT IN A FLASH MEMORY DEVICE

(75) Inventors: Nicolas Nagel, Dresden (DE); Dominik Olligs, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/157,143

(22) Filed: Jun. 20, 2005

(65) Prior Publication Data

US 2006/0286796 A1 Dec. 21, 2006

(51) Int. Cl.
*H01L 21/4763* (2006.01)
(52) U.S. Cl. .............................. 438/618; 257/E21.575; 257/E21.597; 257/E21.577; 257/E21.627; 257/E21.641
(58) Field of Classification Search ................ 438/618, 438/523, 533; 257/E21.577, E21.597, E21.575
See application file for complete search history.

(56) References Cited

U.S. PATENT DOCUMENTS

| | | | |
|---|---|---|---|
| 5,879,986 A * | 3/1999 | Sung ........................... 438/253 |
| 6,417,048 B1 | 7/2002 | Tseng | |
| 6,489,201 B2 * | 12/2002 | Yoon ........................... 438/257 |
| 6,593,654 B2 * | 7/2003 | Oyamatsu ................... 257/758 |
| 6,624,018 B1 * | 9/2003 | Yu et al. ..................... 438/239 |
| 6,756,271 B1 | 6/2004 | Satoh et al. | |
| 6,930,001 B2 * | 8/2005 | Gil ............................. 438/258 |
| 2001/0048624 A1 | 12/2001 | Morimoto | |
| 2003/0017698 A1 * | 1/2003 | Ikeda ......................... 438/687 |
| 2004/0175932 A1 * | 9/2004 | Kim et al. .................. 438/637 |
| 2004/0262770 A1 * | 12/2004 | Ozawa ....................... 257/758 |
| 2005/0142870 A1 * | 6/2005 | Park ........................... 438/672 |
| 2006/0073697 A1 * | 4/2006 | Wang et al. ................ 438/623 |
| 2006/0118962 A1 * | 6/2006 | Huang et al. ............... 257/760 |
| 2006/0121717 A1 * | 6/2006 | Yu et al. ..................... 438/612 |

* cited by examiner

*Primary Examiner*—W. David Coleman
*Assistant Examiner*—Su C. Kim
(74) *Attorney, Agent, or Firm*—Slater & Matsil, L.L.P.

(57) ABSTRACT

A method of forming a contact between a bitline and a local interconnect in a flash memory device comprises forming a hard mask layer on a planarized surface that includes an exposed top section of the local interconnects prior to depositing an oxide dielectric layer. The hard mask layer may be composed of a material that has an etch resistance as compared to the interlayer dielectric material, e.g., nitride. Openings in the hard mask define positions for the contacts to the local interconnects exposed in the top section.

18 Claims, 10 Drawing Sheets

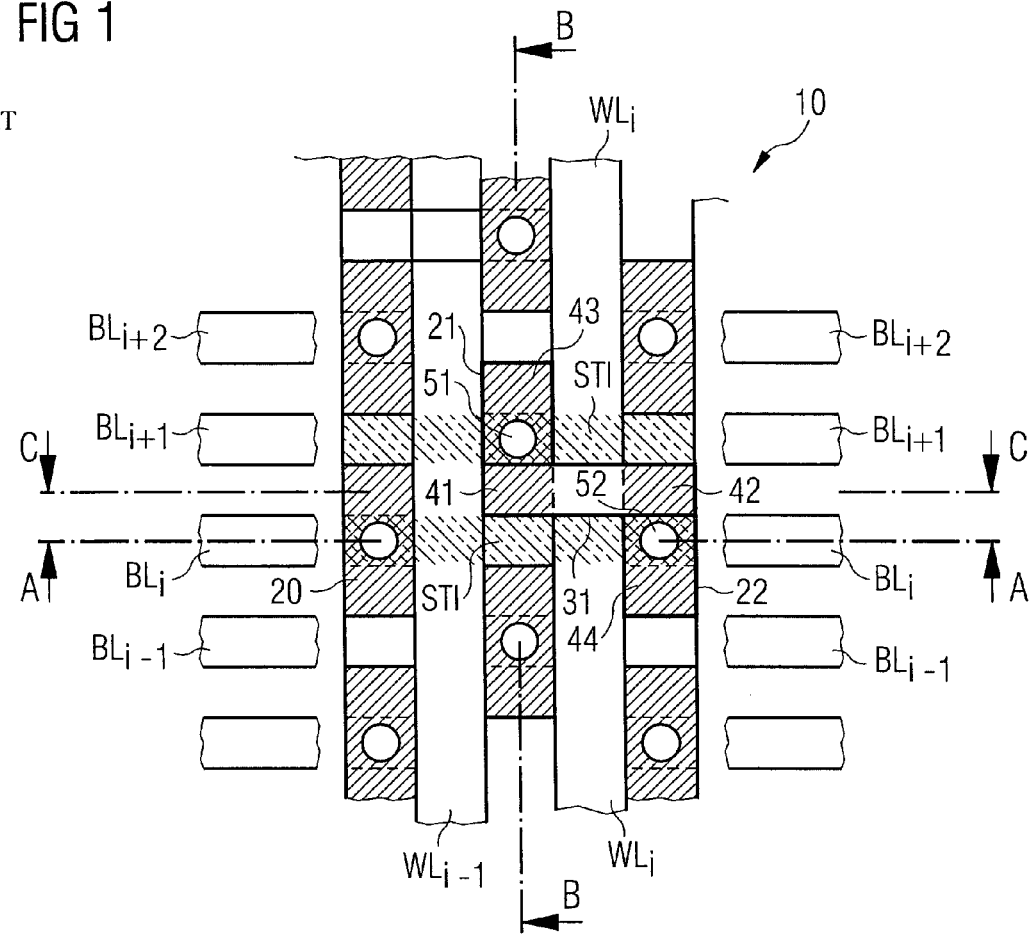

METHOD OF FORMING A CONTACT IN A FLASH MEMORY DEVICE

TECHNICAL FIELD

The invention relates to a method of forming a contact in a flash memory device. The invention further relates to manufacturing a memory array of a flash memory device. The invention particularly relates to flash memory arrays comprising local interconnects, which provide an electrical connection between source and drain regions of neighboring memory cells.

BACKGROUND

Non-volatile memory, or more precisely: flash memory, has become increasingly important for mass storage media, cards and code-products. Memory cells of a flash memory array are based on trapping of charge carriers in a floating gate or in a dielectric memory layer confined by thin confinement layers, e.g., an ONO-layer (Oxide-Nitride-Oxide) sequence. These non-volatile memory cells are electrically programmable and erasable.

Two major flash memory device concepts relate to so-called NOR- or NAND-flash devices. NOR-flash devices are suited for the storage of software and program files due to the considerably faster access to memory cells allowed by this flash concept. NAND-flash devices are suited for the storage of large amounts of user data due to its considerably smaller memory cell size.

Recently, an intermediate cell concept has been developed allowing the storage of two bits per cell. Therein, a wordline crossing an active substrate and provided with an ONO-layer sequence is designed to charge-trap channel hot electrons (CHE) in confined regions of the ONO-layer sequence on both sides of a channel or depletion region in the substrate. In other words, the charge carriers are trapped in a location of the ONO-layer sequence sandwiched between the wordline (or gate electrode) and the active substrate, where separated source and drain regions, the channel region and the gate electrode approach each other.

Charge carriers moving from source to a drain through the channel or depletion region are accelerated and gain enough energy in order to penetrate through the lower confinement layer of the ONO-layer sequence. These charge carriers are then trapped within the memory layer. As a result, the trapped charge carriers influence the threshold voltage of the cell transistor structure. Different programming states can then be read by applying the appropriate reading voltages.

As a consequence, programming and reading occurs by means of applying different voltages to each two bitlines connecting opposite source and drain regions of a transistor. Which of the two locations per cell is read out depends on the current direction according to the voltage drop between the two bitlines.

Although being based on the NOR-flash device concept, the memory array as described above, which is referred to as a "NROM", has a considerably increased memory density because each cell can store two bits. As a result, the NROM-device concept may achieve advantages, which are typical of a NAND-flash device, while allowing fast memory cell access. For this purpose, the packaging of bitlines is increased in order to contact the source and drain regions. Each bitline is thus connected with each two source/drain regions per contact. The reason is that each memory cell has to be contacted by two different bitlines for providing the current measurement circuit for a respective memory cell.

FIG. 1 illustrates this concept in a top view of a portion of a memory array 10. Multiple wordlines WL cross over the substrate surface forming, among others, a transistor 31, which further comprises a source region 41 and a drain region 42. The bit storage locations are represented in this top view by the dots on the wordline boundaries. Multiple bitlines BL orthogonally traverse the wordlines WL within a superior metal level. Of those bitlines, bitlines $BL_I$ and $BL_{I+1}$ are conductively connected to the source region 41, and the drain region 42 respectively. This connection is established by means of a stacked contact. The stacked contact comprises a local interconnect 21, 22 in a bottom portion and a bitline contact 51, 52 in an upper portion.

The local interconnects 21 or 22, respectively, connect each two source/drain regions 41, 43 and 42, 44 of each two neighboring memory cells along the wordline direction. The local interconnects 21, 22 are further provided with a contact 51, 52 for connecting the source/drain regions with the bitlines $BL_I$ or $BL_{I+1}$, respectively. Contacts 51, 52, therefore, have an offset position with respect to transistor 31.

The result of this concept is that the density of bitlines may correspond with that density of the active areas yielding the respective source and drain regions 41, 42 of transistor 31. Note that the active areas are separated by regions provided with a shallow trench isolation (STI). Two of those STI regions are indicated as dotted areas in FIG. 1.

However, what is also visible from FIG. 1 is that the contacts 51, 52 must be manufactured with a considerably smaller width than the underlying local interconnects 21, 22 and that a high degree of alignment of the contacts 51, 52 with the bitlines BL is necessary.

According to a conventional process for manufacturing a memory array 10 such as that shown in FIG. 1, a contact is manufactured by depositing a dielectric layer upon a planarized surface that is formed above the wordlines WL and the local interconnects, which are already established. In the planarized surface, top sections of the local interconnects 21, 22 are exposed, i.e., laid open. A first lithographic step is applied to etch trenches for contacts 51, 52 into the dielectric layer down to the previously exposed local interconnects 21, 22. This is followed by a second lithographic structuring to etch the bitline trenches down to a predefined depth into the dielectric layer.

FIGS. 2a and 2b show side views of the resulting structures according to prior art. Note, that the same reference numerals denote the same features in the figures if not stated otherwise throughout this document. FIG. 2a shows a side view along line A-A of FIG. 1 and FIG. 2b shows a side view along a corresponding line B-B. Line B-B is parallel to the wordline direction, but actually extends between each two wordlines $WL_I$, $WL_{I-1}$.

An isolation layer 60 serves to separate each two local interconnects 21, 22 and a dielectric layer 61' serves to separate bitlines BL from wordlines WL and from local interconnects 21, 22. Dielectric layer 61' thus includes a function of an interlayer dielectric. Bitlines BL and contacts 51 are filled with conductive material by a damascene process. As can be seen from FIGS. 2a and 2b, alignment between the bitlines BL and contacts 51 is critical. A small amount of misalignment of the bitlines towards the left direction with respect to the contacts 51 is indicated by arrows in FIG. 2b. This misalignment may lead to shorts or at least to a smaller budget of overlay accuracy for the corresponding two lithographic mask processes.

SUMMARY OF THE INVENTION

In one aspect, the present invention increases the quality of flash memory devices. In a further aspect, the present invention increases the yield of flash memory device production. In still a further aspect, the overlay budget available is increased when producing flash memory devices. A still further aspect results in reduced costs and efforts in semiconductor flash memory manufacturing.

As an example, a method forms a contact between a bitline and a local interconnect in a flash memory device. The local interconnect provides an electrically conductive connection to a first and a second source/drain region of two neighboring memory cells arranged along a wordline of the flash memory device. In one embodiment, a substrate covered with a structuring is provided. The substrate includes the first and second source/drain regions. The wordline and the local interconnect. The structuring has a planarized surface with a top section of the local interconnect exposed therein. A first dielectric layer is deposited above the planarized surface and the top section. A first opening is etched into the first dielectric layer to expose a portion of the top section of the local interconnect. A second dielectric layer is deposited upon the first dielectric layer and into the first opening. The second dielectric layer is provided with an etch selectivity with respect to the first dielectric layer. An etch mask is formed upon the second dielectric layer and has a second opening to define a trench representing the bitline. The second opening overlaps with the first opening. The second dielectric layer is etched using the etch mask, such that the trench representing the bitline is formed, and the top section of the local interconnect is exposed. The second opening of the etch mask overlaps with the first opening. The etch mask is removed and a conductive filling is deposited into the first opening of the first dielectric layer upon the top section of the local interconnect, for forming the contact to the local interconnect.

Starting from a planarized surface, that comprises the local interconnects exposed therein, i.e., being laid open, a dielectric layer is deposited first, which is arranged to form a hard mask. The material chosen for this first dielectric layer provides etch resistance with respect to the dielectric material of the second dielectric layer deposited afterwards. In other words, the second dielectric layer comprises an etch selectivity with respect to an etch process, such that the hard mask provides an etch stop when the second dielectric layer is etched down to the bottom surface.

As a consequence, embodiments of the invention provide a hard mask that is buried by the second dielectric layer and is retained above the planarized surface during further processing.

Openings are applied to the hard mask where local interconnects have to be contacted by the contacts. The local interconnects typically have a widened top section, such that a corresponding alignment of the hard mask openings with respect to the local interconnects do not impose a problem. However, embodiments of the invention are not limited to the specific detail of a widened top section.

The opening in the hard mask may involve a lithographic structuring step with applying a resist to the surface of the (first) dielectric layer, exposing the region where the openings are to be performed to exposure light, developing the exposed resist, and transferring the pattern into the dielectric layer, i.e., the hard mask. It is noted that the invention is further not limited to the detailed approach for lithographically structuring the openings.

The second dielectric layer is deposited upon the hard mask and also structured in a lithographic step. The corresponding etch mask, e.g., a resist or other hard mask, comprises openings for trenches, which are to form the bitlines. Etching the second dielectric layer down to the hard mask provides the advantage that an automatic etch stop can be achieved, which can be independent of any time control.

Further, according an embodiment of the invention the etching of the second dielectric layer may be performed anisotropically. As a consequence, only those portions of the hard mask openings in first dielectric layer are etched or reopened, which overlap with the etch mask openings of the second dielectric layer. As a result, the contacts established between the local interconnects and the bitlines are fully self-aligned with the respective bitlines. Shorts are advantageously impeded and—provided that the openings in the hard mask layer are manufactured with a reasonable width—a more uniform width of contacts yielding a predefined electrical resistance of the contacts can be established.

As in the prior art case, two mask steps are necessary to form the contact according to embodiments of the invention. However, only one etch of the second dielectric layer is performed instead of the dual etching according to prior art. Misalignment of the two masks according to prior art led to an undesirably enlarged width of the corresponding contact holes.

An aspect of the invention relates to the material employed for the hard mask. Preferably, a nitride, or an oxynitride is employed for the first dielectric layer in order to yield an etch selectivity of the oxide material of the second dielectric layer, typically an oxide deposited in a TEOS process.

According to a further aspect of the invention a third dielectric layer is deposited upon the planarized surface prior to depositing the first dielectric layer. This further layer may be composed of an oxide, or an oxynitride, if the first dielectric layer is a nitride. This third layer has the advantage to reduce the hard mask thickness and to keep the stack thickness sufficiently large in order to match isolation and capacitance needs.

Nevertheless, a single layer of only nitride adversely has the advantage of preventing sidewalls of the contact hole from undergoing disadvantageous under-etching.

The bi-layer stack of the first dielectric layer (hard mask) and the third dielectric layer, or alternatively the first dielectric layer alone, has thickness limitations due to the requirement that the opening in the hard mask must be reliably filled (i.e., without any voids) with material of the second dielectric layer.

The bi-layer stack of the first dielectric layer (hard mask) and the third dielectric layer, or alternatively the first dielectric layer alone, further has thickness limitations due to the requirement, that the contact hole must be reliably filled with the conductive material, and due to the fact that the first and third or only the first layer serve as an interlayer dielectric and electrical requirements must be met. An advantageous thickness is provided by, e.g., 80 nm-120 nm, but the invention is not limited thereto.

It is noted that embodiments of the invention are not limited to flash memory devices. It will become clear to a person skilled in the art, that the method and the configuration of the device components can as well be embodied with other types of memories, in particular static or non-volatile memories or even dynamic memories with random access (DRAM) in which the need for stacked contacts in a memory array exist.

BRIEF DESCRIPTION OF THE DRAWINGS

For a more complete understanding of the present invention, and the advantages thereof, reference is now made to the following descriptions taken in conjunction with the accompanying drawing, in which:

FIG. 1 shows a top view of an memory array according to prior art;

FIG. 2, shows side views of the prior art embodiment shown in FIG. 1 along lines A-A (a) and B-B (b);

Figure 2A:
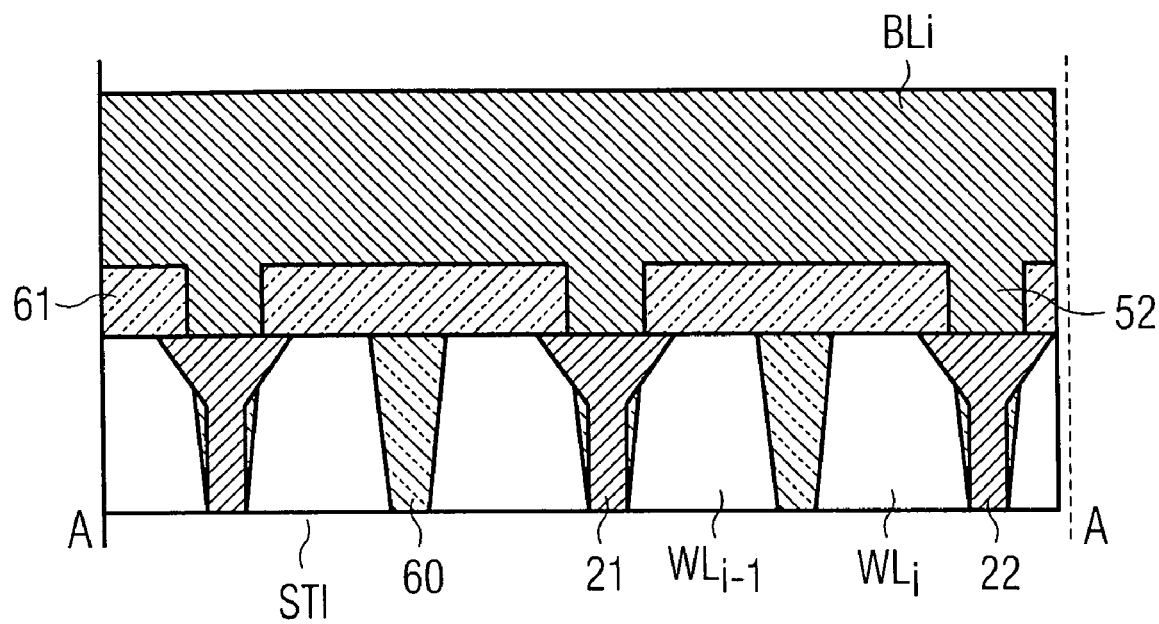
FIGS. 2A and 2B, collectively
Figure 2B:
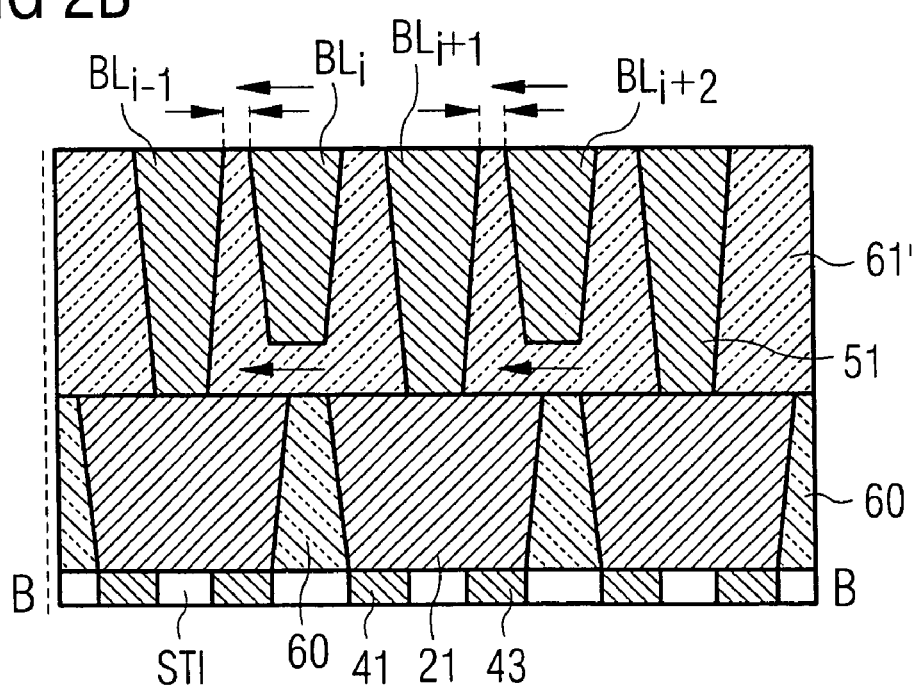

The following list of reference symbols can be used in conjunction with the figures:

1 confinement layer (O)
2 memory layer (N)
3 confinement layer (O)
4 poly silicon gate
5 tungsten silicide
6 nitride capping layer
7 sidewall spacer
10 memory array
12 planarized surface
14 oxide/oxynitride layer, third dielectric layer
16 nitride/oxynitride layer, first dielectric layer
18 openings in nitride layer (hard mask)
20, 21, 22 local interconnects
25 top section of local interconnects
31 transistor
41-44 source/drain regions
51, 52 contacts to interconnects
60 oxide layer (BPSG) for wordline interspacing
61 oxide layer (TEOS), second dielectric layer (invention)
61' oxide layer (TEOS), second dielectric layer including interlayer dielectric (prior art)
63 polysilicon or nitride layer, etch mask for interlayer dielectric
68 openings in etch mask
70 conductive filling
82 contact holes
84 bitline trenches
95 overlap portion
108 openings in etch mask for contact holes (prior art)
201 bitline interspacing (invention)
202 overlay budget increase according to invention
203 bitline interspacing (prior art)
BL bitline
WL wordline
STI shallow trench isolation

DETAILED DESCRIPTION OF ILLUSTRATIVE EMBODIMENTS

Figure 3A:
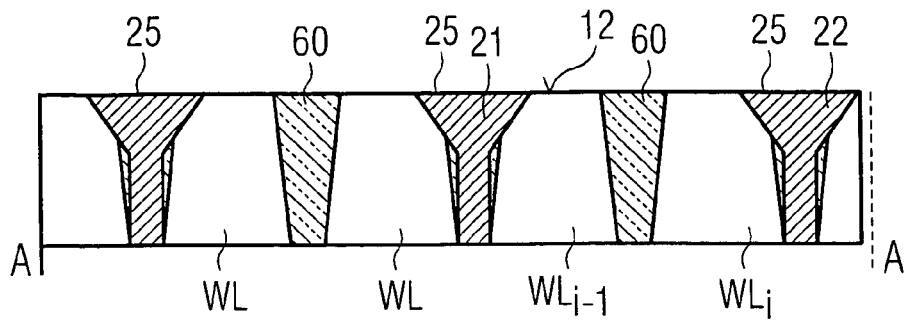
FIGS. 3-9 show cross sections along lines A-A (a) and B-B (b) in FIG. 1 with respect to a sequence of process steps according to an embodiment of the present invention.
Figure 3B:
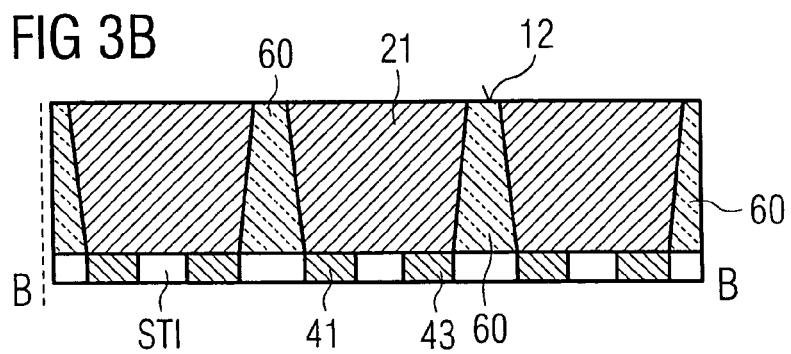

An embodiment of the method according to the invention is shown with reference to FIGS. 3-9, which display cross sections of the memory array 10 along lines A-A and B-B as indicated in FIG. 1. FIG. 3, which includes FIGS. 3a and 3b, displays an intermediate step of a sequence of steps for manufacturing a memory array according to an embodiment of the invention, the intermediate step serving as a starting point herein in order to explain the details of the invention.

However, a short overview of the processing steps that lead to the situation shown in FIG. 3 is provided. A series of parallel wordlines WL is formed on the surface of a semiconductor substrate. The wordlines WL may comprise—from bottom to top—a layer sequence of dielectric materials, i.e., an ONO-layer serving as a gate dielectric of the transistor 31 and simultaneously serving as the memory layer 2 being sandwiched by confinement layers 1, 3. A conductive layer of polysilicon 4 forming a gate electrode, a conductive layer of metal silicide 5 to improve low resistance characteristics, e.g., tungsten silicide, and a capping layer 6 made of, e.g., nitride are further included. The wordlines WL further comprise sidewall spacers 7 composed of, e.g., an oxide or nitride.

Figure 12:
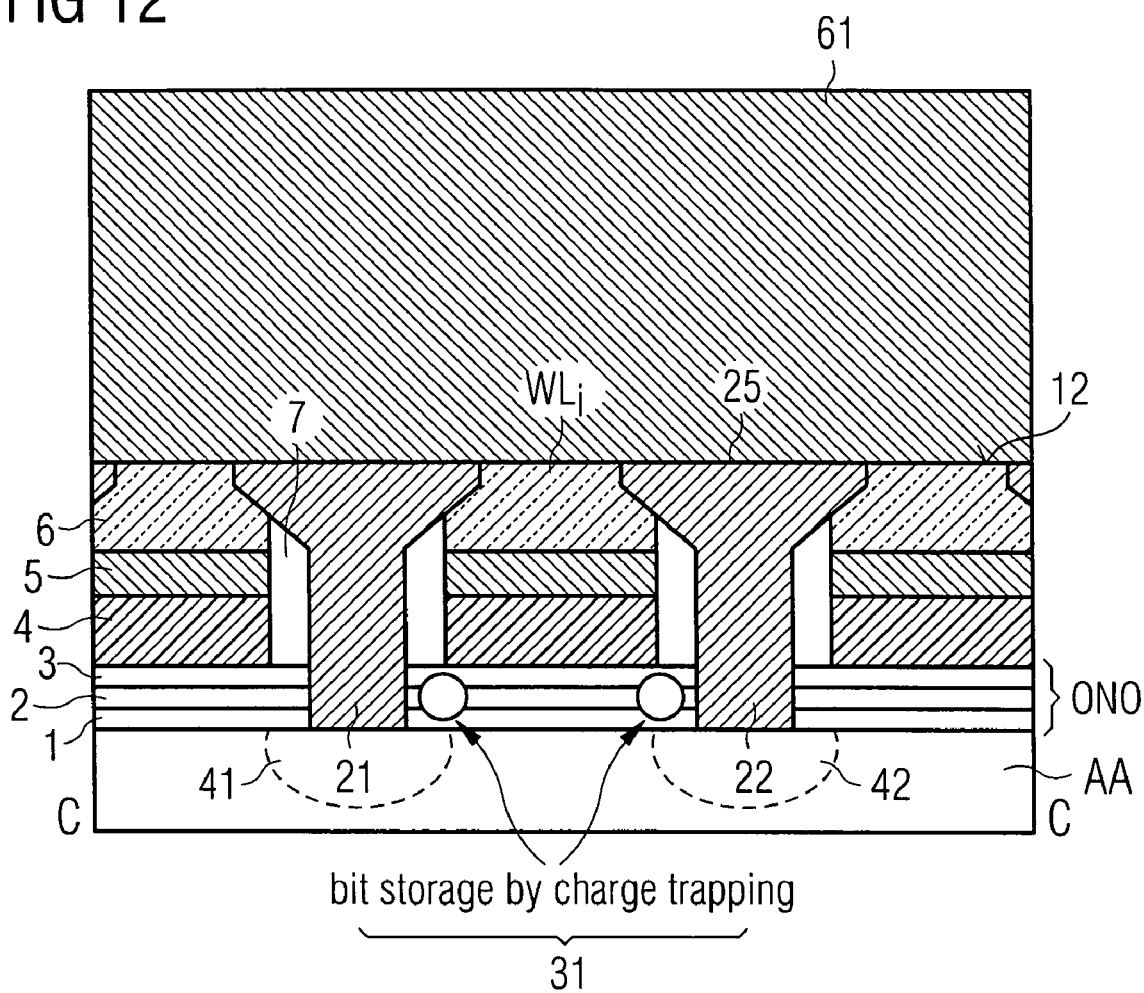
FIG. 12 shows a cross section along line C-C in FIG. 1 of the memory array according to the embodiment of the invention.

A detailed side view of wordlines WL along a line C-C in FIG. 1 is visible from FIG. 12. It is noted, that the memory layout drawn in FIG. 1 is also applicable in combination with the features according to embodiments of the invention, but does not limit the invention to the specific details shown there. Further, the details of the wordline evident from FIG. 12 are not shown in FIGS. 3-9 in order to keep the illustrations as simple as possible.

It is further noted that the wordline may—according to another embodiment of the invention—even be embodied as a buried wordline formed within a trench of the semiconductor substrate. What is important here is that bitlines BL cross the wordlines WL in a conductive layer above, thereby necessitating an electrically conductive contact between active areas (i.e., source/drain regions) in the substrate and the bitlines in order to provide access to the storage content of a memory cell.

Referring back to the situation displayed in FIG. 3, spaces between the wordlines WL are filled with an oxide 60, e.g., BPSG (bor phosphor silicate glass). Next, an oxide liner (TEOS deposition, tetra ethyl ortho-silicate) is deposited, which is used for carrying out a chemical mechanical polishing (CMP) as will be explained below. This oxide liner is optional. A polysilicon hard mask is then deposited to define holes for the local interconnects 21, 22, etc.

For this purpose, a lithographic step is performed using a resist process, i.e., coating the substrate with a resist, exposing the resist and developing this resist to form an etch mask. The mask is used to etch the polysilicon layer. The resist is then removed and the resulting polysilicon hard mask is employed to etch the TEOS-oxide liner and the oxide layer 60 down to the substrate surface, i.e., the source/drain regions 41, 43 and a portion of the shallow trench isolation STI separating each two source/drain regions 41, 43 of two neighboring memory cells (see FIG. 3b) in order to form a local interconnect 21, 22.

A Ti/TiN liner is then deposited and the holes for the interconnects are filled with tungsten (W). Thereafter, the CMP step as stated above is executed, which stops on either the TEOS-oxide liner or the nitride capping layer on top of the wordlines WL. As a consequence, a planarized surface 12 as shown in FIG. 3 results from these steps. It is noted that the local interconnects 21, 22 preferably comprise widened top sections 25 within the planarized surface 12, however, interconnects 21, 22 having, for example, straight vertical sidewalls are similarly preferable. The top sections 25 are surrounded by isolation material 60 of BPSG and/or the isolating capping material (nitride) of the wordlines.

Figure 4A:
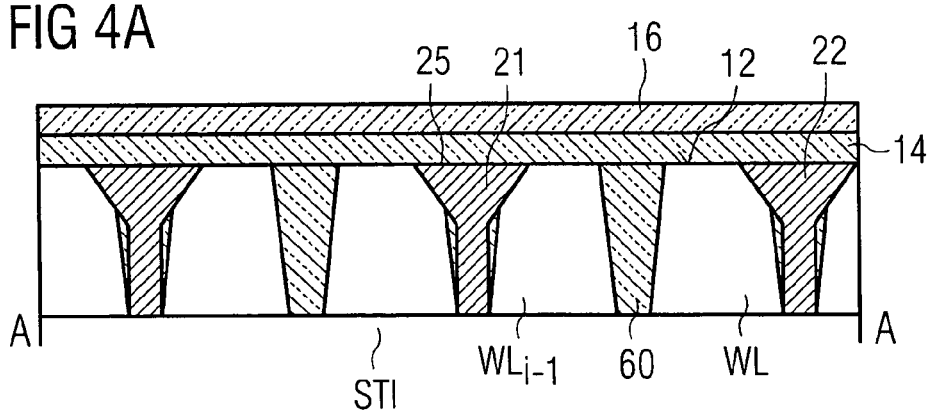
Figure 4B:
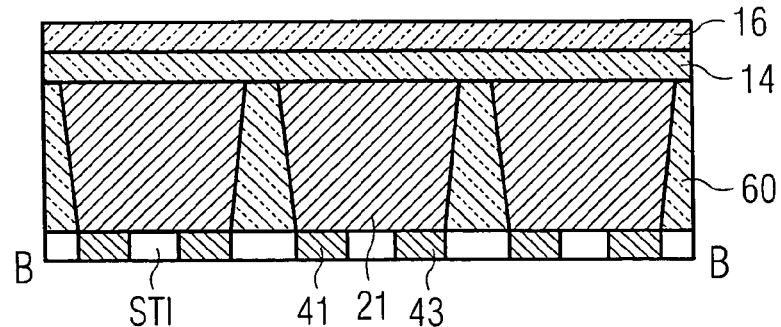

FIG. 4, which includes FIGS. 4a and 4b, shows the deposition of first an oxide layer 14 and second a layer 16 of nitride or oxynitride upon the CMP-planarized surface 12 and on the exposed top sections 25 of the local interconnects 21, 22. Both layers have a thickness of, e.g., 50 nm.

Figure 5A:
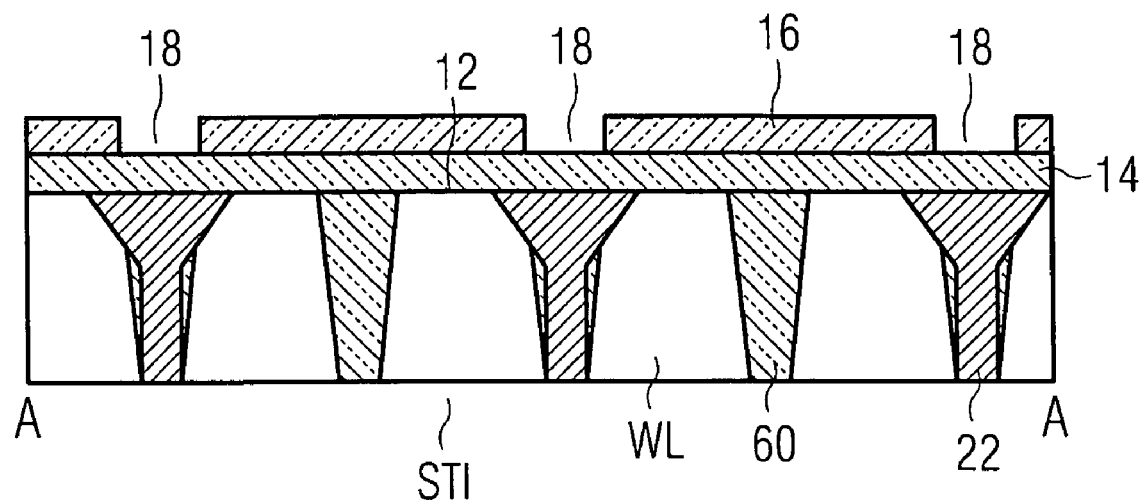
Figure 5B:
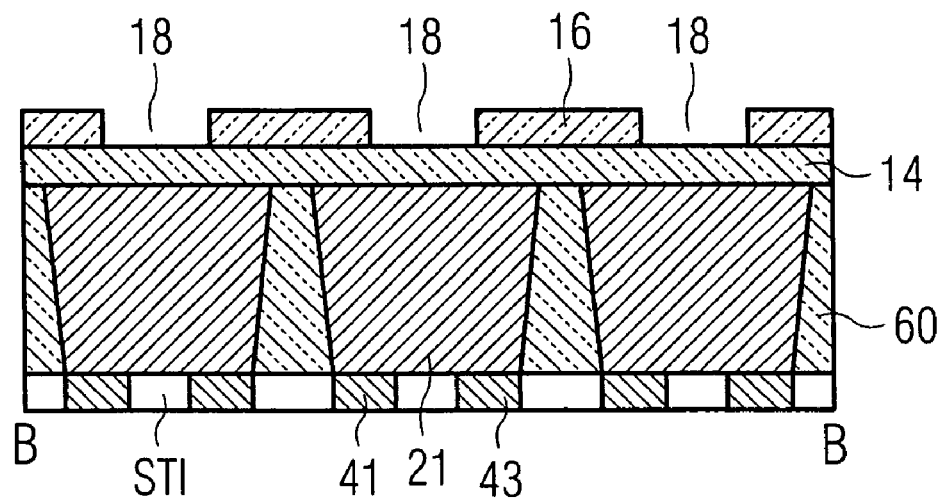

FIG. 5, which includes FIGS. 5a and 5B, shows the result of a lithographic step applied to the nitride layer 16, which now serves as a hard mask. Openings 18 are formed thereby in nitride layer 16. The openings 18 expose portions of the oxide layer 14 beneath. Openings 18 define portions of the top section 25, which are available for establishing a contact to a bitline that is due to be formed. The lithographic structuring step may include coating the wafer with a resist, exposing the resist, developing the resist and etching the hard mask using the resist mask (not shown in FIG. 5).

Figure 6A:
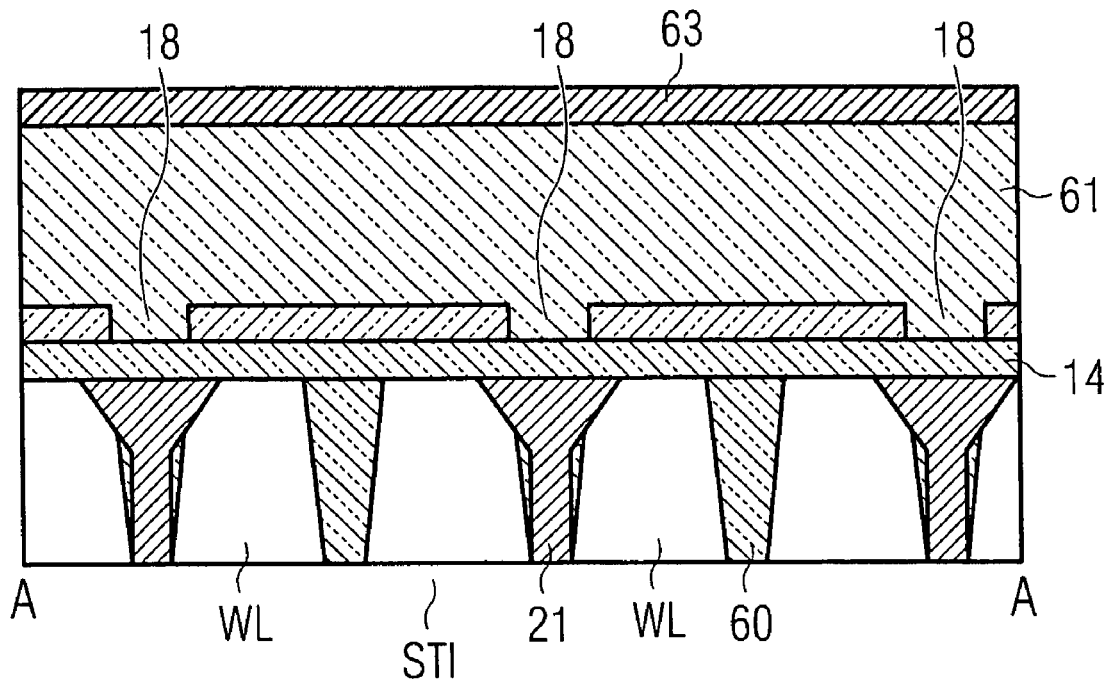
Figure 6B:
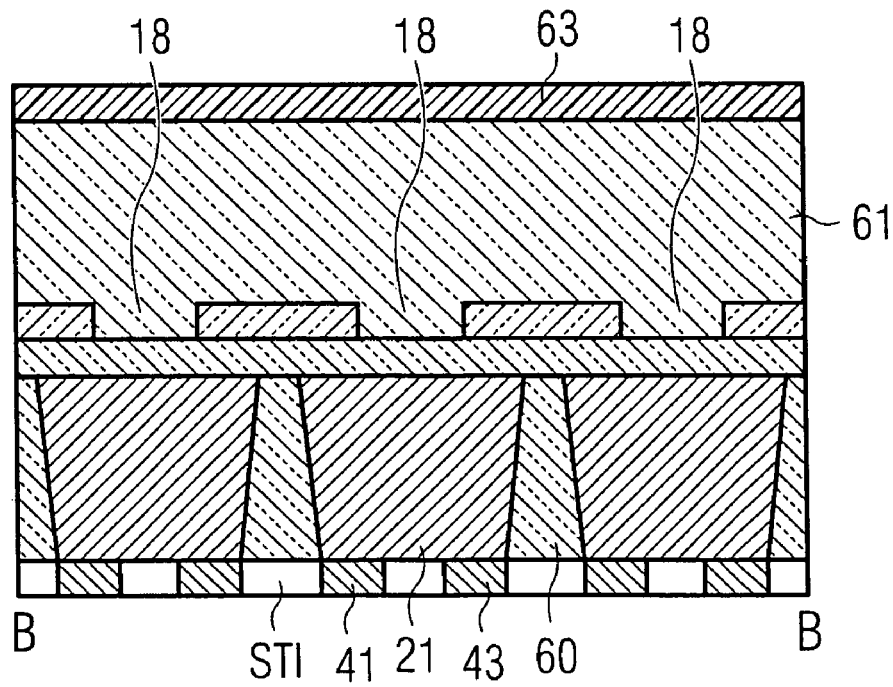

FIG. 6, which includes FIGS. 6a and 6b, shows the next step of depositing an oxide layer 61, e.g., a TEOS-oxide, upon the hard mask, i.e., nitride layer 16 and into openings 18. Layers 14, 16 together with cap nitride layer 6 serve as an interlayer dielectric for isolating bitlines above from wordlines below. Further, a layer 63 of polysilicon or nitride is deposited on top of the oxide layer 61. This further layer 63 is intended to provide an etch mask for the bitline trenches 84 and simultaneously for the contact holes 82 to be formed within oxide layer 61.

Figure 7A:
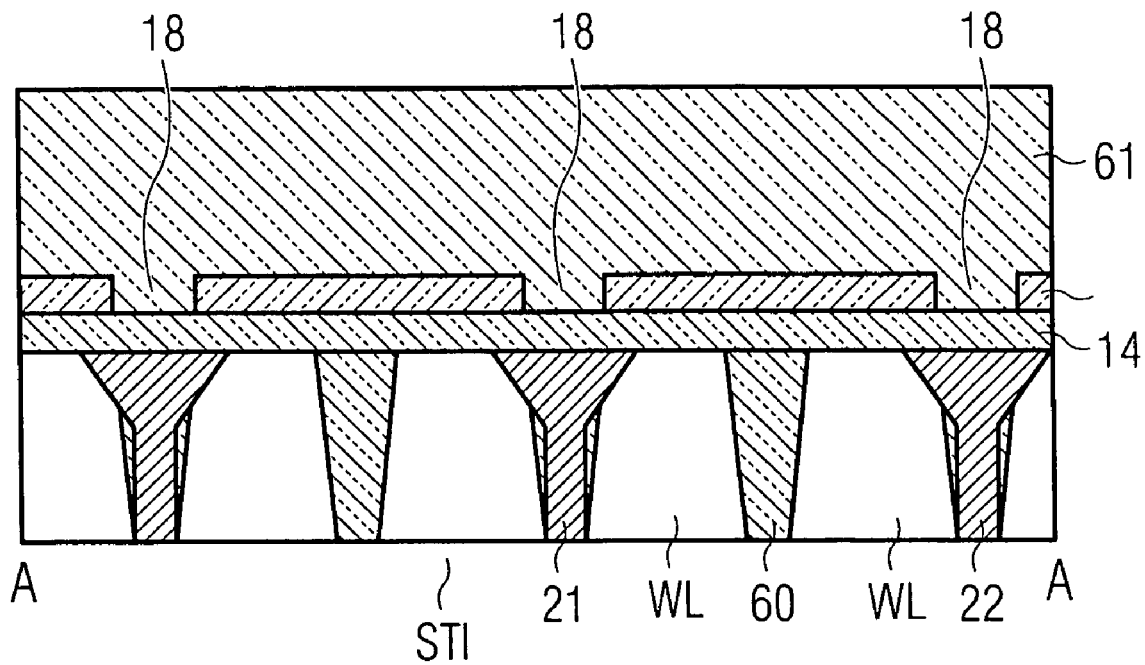
Figure 7B:
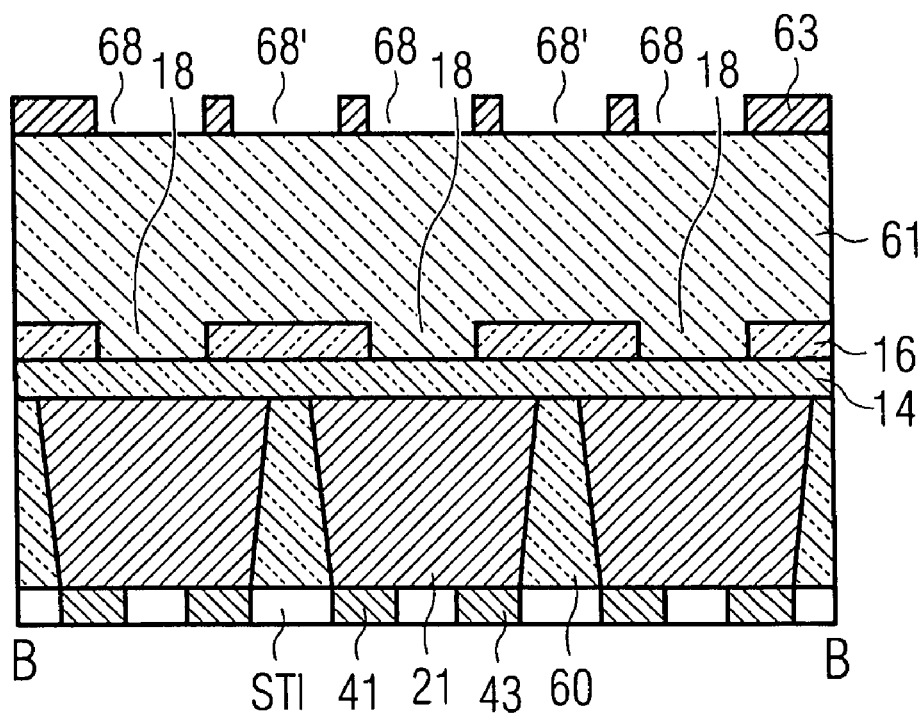

FIG. 7, which includes FIGS. 7a and 7b, shows the result of the corresponding (second) lithographic step. As FIG. 7a displays a cross section along a bitline due to be formed, the polysilicon or nitride etch mask layer 63 is completely removed from the surface section of layer 61. In the cross sectional view of FIG. 7b, however, openings 68 indicate the positions of bitline trenches 84 due to be etched. It is noted that openings 68 in the etch mask layer 63 (which is in fact a hard mask layer as well, but a simple resist layer would as well represent an appropriate etch mask according to a further embodiment) are aligned with openings 18 in the nitride hard mask layer 16. The hard mask layer 63 may be etched using a lithographic process as stated in the previous examples, i.e., coating with a resist, exposing, developing, etching layer 63, stripping the resist, etc.

Figure 8A:
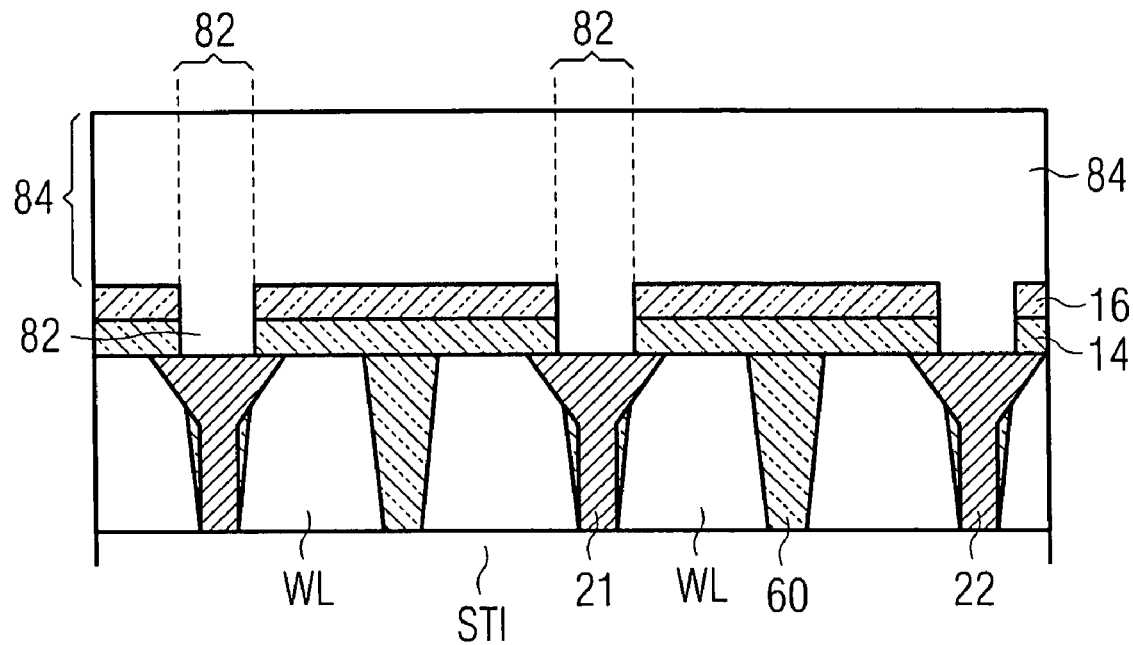
Figure 8B:
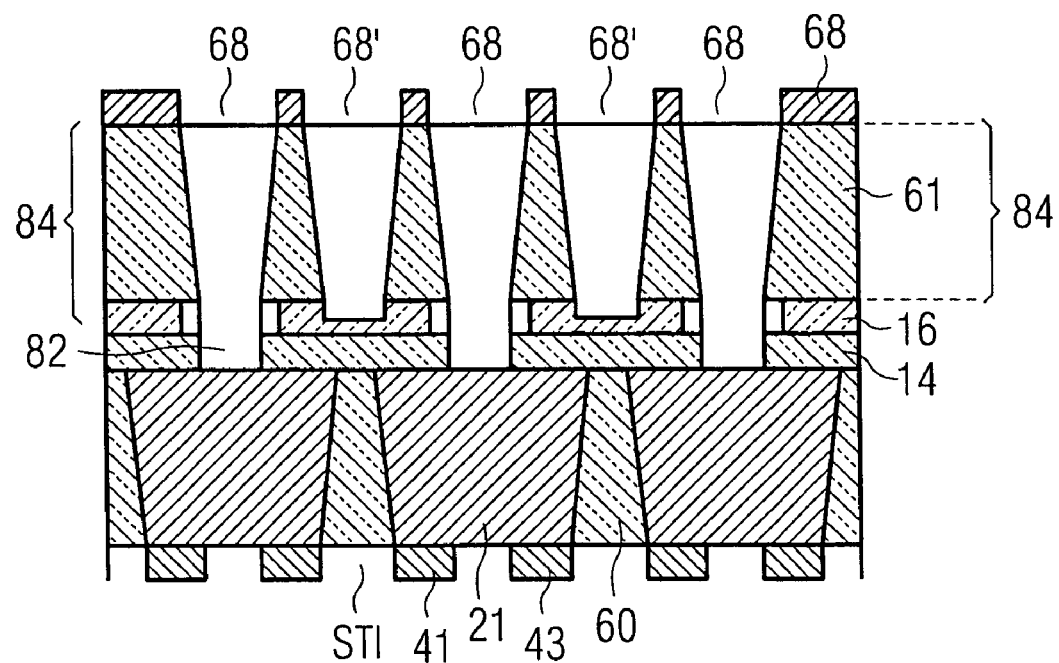

FIG. 8, which includes FIGS. 8a and 8b, displays the situation after etching the layer 61 using patterned layer 63 as an etch mask. The oxide of layer 61 is anisotropically etched down to the nitride hard mask layer 16, where there is no opening 18, and down to top section 25, where openings 18 provide a free passage to the surface of the local interconnects 21, 22. Reference numerals 82 and 84 indicate the etched spaces of the contact holes and bitline trenches, respectively. It is noted that contact holes 82 are thus self-aligned with bitline trenches 84.

Figure 9A:
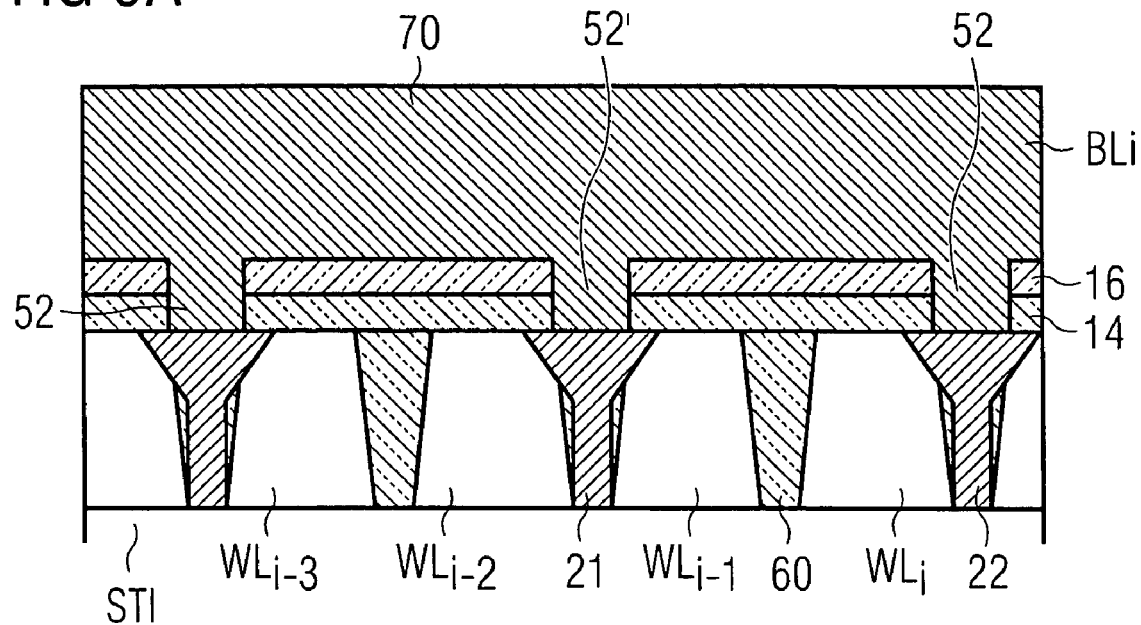
Figure 9B:
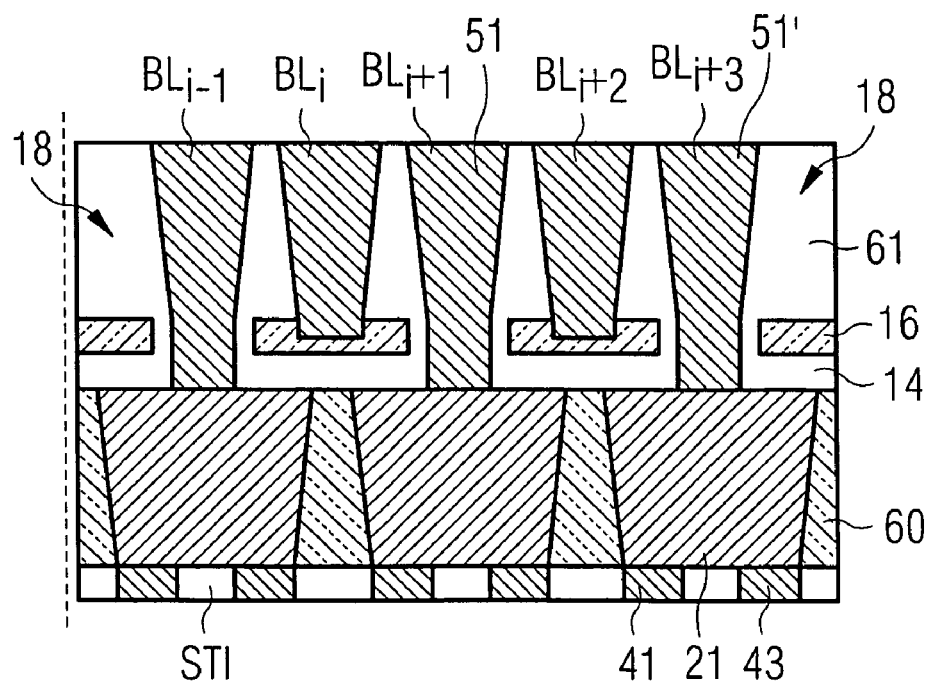

FIG. 9, which includes FIGS. 9a and 9b, shows the situation resulting after filling the trenches 84 and contact holes 82 with conductive material 70, e.g., tungsten, in a damascene process, stripping the poly silicon or nitride etch mask layer 63 and applying a CMP step. The CMP-step is performed to confine the metal layer 70 into the trenches 84 and contact holes 82 as shown in FIG. 9.

As it is clearly visible from FIG. 9b, the width of the resulting contacts 51, 51', 52, 52' is considerably smaller than the width of the hard mask openings 18. Further, since the etching of the oxide layer 61 is performed anisotropically, only overlapping portions 95 of openings 18 and 68 locally yield a formation of a contact hole 82.

Figure 10:
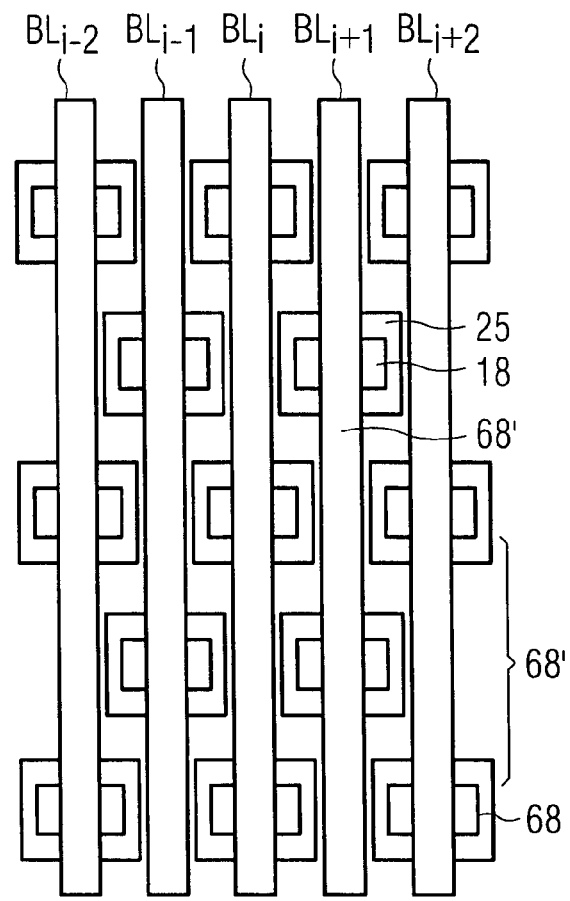
FIGS. 10, 11 show in top views a schematic illustration of the contact hole and bitline width reduction due to the method of the invention.
Figure 11:
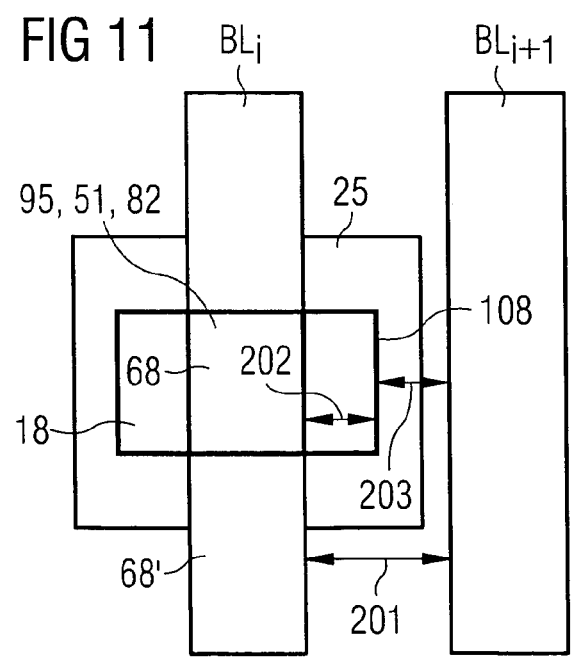

This is illustrated in more detail in FIGS. 10 and 11. FIG. 10 shows an overall top view of the trench and contact hole locations defined by openings 18 and 68, respectively, with respect to the top sections 25 of the local interconnects 21, 22. FIG. 11 zooms into one example contact hole position.

Top section 25 is available for establishing a contact in order to yield a connection with the local interconnect 21, 22. Opening 18 in nitride layer 16 restricts the contact area as shown in FIG. 11. Opening 68 in the poly or nitride etch mask layer 63 further restricts the available area to that indicated by overlap portion 95 of openings 18 and openings 68, which define bitline trenches 84. The formation of contact holes 82 is thus restricted to that overlap portion 95 and is thus aligned with the bitline trenches 84.

In prior art, however, openings 108 serving to form contact holes 51, 52 and corresponding to openings 18 according to embodiments of the invention would have been realized in an etch mask formed upon the oxide layer 61—and not below this layer according to embodiments of the invention. As the areas of the bitline trenches and the contact holes simply add to each other, an overlay budget for the lithographic structuring step has to be determined from a reduced distance between a trench of a neighboring bitline $BL_{I+1}$ and the hole due to the opening 108, which is indicated by arrow 203 in FIG. 11.

On the contrary, the overlay budget is increased due to this embodiment of the invention, since the contact hole is formed in a self-aligned manner with the bitline trench as indicated by arrow 202. The bitlines BL will, therefore, have a uniform width and interspacing 201 in their length direction even at locations where contacts 51, 52 are present.

What is claimed is:

1. A method of forming a contact between a bitline and a local interconnect in a flash memory device, the method comprising:

providing a substrate covered with a structure, the substrate including a plurality of first and second source/drain regions, and a like plurality of second source/drain regions, a plurality of local interconnects extending between and electrically connecting one each of said plurality of first source/drain regions to one each of said second source/drain regions, a plurality of wordlines separating adjacent ones of local interconnects, said structure having a planarized surface comprising top sections of said plurality of local interconnects and the top surfaces of said wordlines, said top sections of said plurality of local interconnects exposed therein;

depositing a first dielectric layer above the planarized surface and said top section, said first dielectric comprising at least a bottom layer and a top layer;

etching a first opening into the top layer of said first dielectric layer above a portion of said top section of the local interconnect;

depositing a second dielectric layer over the first dielectric layer subsequent to said step of etching said first opening, a portion of said second dielectric filling said first opening in said first dielectric layer, wherein the second dielectric layer is provided with an etching selectivity with respect to said first dielectric layer;

forming an etch mask over the second dielectric layer, the etch mask having a second opening to define a trench in said second dielectric layer representing said bitline, said second opening overlapping with said first opening;

etching said second dielectric layer using said etch mask, such that said trench representing the bitline is formed, said etching step further including etching through said portion of said second dielectric layer filling said first opening to define a via in said second dielectric layer such that said top section of the local interconnect is exposed in an area where said second opening of said etch mask overlaps with said first opening; and removing said etch mask and depositing a conductive filling into said first opening of the first dielectric layer upon the top section of said local interconnect and into said via formed in said second dielectric layer for forming the contact to said local interconnect.

2. The method of forming a contact according to claim 1, wherein depositing a conductive depositing further includes filling the conductive filling into the trench defined in the second dielectric layer that represents the bitline for simultaneously forming the contact to the local interconnect and the bitline.

3. The method of forming a contact according to claim 2, further comprising the steps of planarizing the surface after filling the trench, the planarizing step exposing the second dielectric layer.

4. The method of forming a contact according to claim 1, wherein depositing a first dielectric layer comprises depositing a nitride or an oxynitride layer.

5. The method of forming a contact according to claim 4, further comprising depositing a third dielectric layer upon the planarized surface and said top section prior to depositing said first dielectric layer, wherein etching the first dielectric layer further includes etching the third dielectric layer to form the first opening.

6. The method of forming a contact according to claim 5, wherein depositing said third dielectric layer comprises depositing an oxide.

7. The method of forming a contact according to claim 5, wherein depositing a first dielectric layer comprises depositing a nitride layer, and wherein depositing said third dielectric layer comprises depositing an oxynitride layer.

8. The method of forming a contact according to claim 5, wherein depositing the third dielectric layer is performed to yield a layer with a thickness of more than 30 nm and less than 90 nm.

9. The method of forming a contact according to claim 8, wherein depositing the third dielectric layer is performed to yield a layer with a thickness of more than 40 nm and less than 60 nm.

10. The method of forming a contact according to claim 1, wherein depositing a conductive filling comprises depositing tungsten.

11. The method of forming a contact according to claim 1, wherein depositing said second dielectric layer comprises depositing an oxide.

12. The method of forming a contact according to claim 1, wherein depositing the first dielectric layer is performed to yield a layer with a thickness of more than 30 nm and less than 90 nm.

13. The method of forming a contact according to claim 12, wherein depositing the first dielectric layer is performed to yield a layer with a thickness of more than 40 nm and less than 60 nm.

14. The method of forming a contact according to claim 1, wherein etching said second dielectric layer comprises etching the second dielectric layer anisotropically.

15. The method of forming a contact according to claim 1, wherein etching the first opening includes etching the second dielectric layer anisotropically.

16. The method of forming a contact according to claim 5, wherein etching the first opening includes etching the third dielectric layer anisotropically.

17. The method of claim 1 further comprising forming another etch mask over the first dielectric layer prior to etching said first opening.

18. The method of claim 1 wherein said step of etching a first opening comprises etching into the top layer and not etching through the bottom layer.

* * * * *